(12) United States Patent
Lim et al.

(10) Patent No.: US 6,284,589 B1
(45) Date of Patent: Sep. 4, 2001

(54) METHOD OF FABRICATING CONCAVE CAPACITOR INCLUDING ADHESION SPACER

(75) Inventors: Han-jin Lim; Byoung-taek Lee, both of Seoul (KR)

(73) Assignee: Samsung Electronics Co., Ltd. (JP)

( * ) Notice: Subject to any disclaimer, the term of this patent is extended or adjusted under 35 U.S.C. 154(b) by 0 days.

(21) Appl. No.: 09/392,906

(22) Filed: Sep. 9, 1999

(30) Foreign Application Priority Data

Nov. 18, 1998 (KR) .................................. 98-49503

(51) Int. Cl.⁷ ................................................ H01L 21/8242
(52) U.S. Cl. .......................... 438/240; 438/595; 438/644
(58) Field of Search ................................. 438/240, 244, 438/253, 387, 396, 595, 628, 636, 644, 654

(56) References Cited

U.S. PATENT DOCUMENTS

| | | | |
|---|---|---|---|
| 5,976,928 | * 11/1999 | Kirlin et al. | 438/240 |
| 6,057,231 | * 5/2000 | Givens et al. | 438/644 |
| 6,093,638 | * 11/1999 | Cho et al. | 438/644 |

OTHER PUBLICATIONS

Y. Kohyama et al., A Fully Printable, Self–aligned and PlanarizedStacked Capacitor DRAM Cell Technology for 1Gbit DRAM and Beyond, VLS Tech. Digest, p. 17, 1997.

* cited by examiner

*Primary Examiner*—Chandra Chaudhari
(74) *Attorney, Agent, or Firm*—Cantor Colburn LLP

(57) ABSTRACT

In accordance with the present invention, a method of fabricating a concave capacitor is provided. The concave capacitor of the present invention includes an adhesion spacer is formed between a concave pattern comprising an interlayer dielectric film and a lower electrode is provided. In the concave capacitor fabricating method, an interlayer dielectric film is formal semiconductor substrate. A concave pattern having a storage node e exposing part of the upper surface of the semiconductor substrate is form by patterning the interlayer dielectric film. An adhesion spacer is formed on t sidewall of the concave pattern exposed by the storage node hole. A lower electrode to cover the adhesion spacer and the upper surface of the semiconductor substrate exposed by the storage node hole is formed in the storage node hole

17 Claims, 5 Drawing Sheets

METHOD OF FABRICATING CONCAVE CAPACITOR INCLUDING ADHESION SPACER

BACKGROUND OF THE INVENTION

1. Field of the Invention

The present invention relates to a method of fabricating semiconductor memory devices, and more particularly, to a method of fabricating a capacitor of a semiconductor memory device.

2. Description of the Related Art

With an increase in the integration of dynamic random access memories (hereinafter abbreviated as DRAM), methods have been proposed, of thinning a dielectric film of a capacitor to increase capacitance in a restricted cell area, or of changing the structure of a capacitor lower electrode to a three-dimensional structure to increase the effective area of a capacitor.

However, even though the above-proposed methods are adopted, it is difficult to obtain a capacitance necessary for device operation in a memory device of 1 G DRAM or more from an existing dielectric. In order to solve the above problem, research has been actively conducted into substituting the dielectric film of a capacitor with a thin film formed of a material having high permittivity, such as, $Ta_2O_5$, $(Ba,Sr)TiO_3(BST)$, $PbZrTiO_3(PZT)$, $(Pb,La)(Zr,Ti)O_3(PLZT)$, among others.

In the capacitor using the above-described high dielectric film, metals of the platinum group or oxides thereof, e.g., Pt, Ir, Ru, $RuO_2$, $IrO_2$, etc., instead of polysilicon are used as an electrode material.

Meanwhile, in a stacked-type capacitor having a three-dimensional structure, the lower electrode becomes higher and the interval between electrodes becomes narrower as the DRAM becomes more highly integrated. Due to limits in the platinum film etch technology, difficulties in separating storage nodes have appeared.

In order to solve this particular problem, a capacitor fabrication method by which difficulties in etching a platinum film can be avoided while using the above high dielectric film has been developed in many fields. For example, a concave capacitor has been proposed by Y. Kohyama et al., Symposium on VLSI Technology Digest of Technical Papers, p. 17, 1997.

According to a method of fabricating the proposed concave capacitor, an interlayer dielectric film is formed on a semiconductor substrate, a storage node hole is formed in the interlayer dielectric film, and ruthenium (Ru) is deposited to a predetermined thickness in the storage node hole, thereby forming a storage electrode.

When the concave capacitor is formed as described above, difficulties in the platinum-group metal etch process can be avoided, and the height of the storage node can be arbitrarily controlled as well. However, when forming the storage node of the concave capacitor, the sidewall of the interlayer dielectric film exposed by the storage node hole is weakly coupled to the storage node, which causes a phenomenon in which the storage node is lifted from the interlayer dielectric film upon subsequent deposition or thermal treatment. When this lifting phenomenon occurs, stress is applied to the entire structure of the capacitor. Thus, a bad influence can be exerted on the dielectric film of the capacitor and a plate electrode. In addition, electrical characteristics may be degraded, due to leakage current in a completely-fabricated capacitor.

SUMMARY OF THE INVENTION

To solve the above problems, it is an object of the present invention to provide a method of fabricating a concave capacitor for semiconductor memory devices, by which a storage electrode is not lifted from an interlayer dielectric film.

Accordingly, to achieve the above object, in the concave capacitor fabricating method, an interlayer dielectric film is formed on a semiconductor substrate. A concave pattern having a storage node hole exposing part a portion of an upper surface of the semiconductor substrate is formed by patterning the interlayer dielectric film. An adhesion spacer is formed on a sidewall of the concave pattern exposed by the storage node hole. A lower electrode to cover the adhesion spacer and the upper surface of the semiconductor substrate exposed by the storage node hole is formed in the storage node hole itself.

The semiconductor substrate includes a contact having one end connected to the active region of the semiconductor substrate and the other end exposed on the upper surface of the semiconductor substrate. Here, the other end of the contact is exposed by the storage node hole. Preferably, the other end of the contact is formed of a material selected from the group consisting of TiN, TiAlN, TiSiN, TaN, TaSiN and TaAlN.

The interlayer dielectric film has a structure in which an etch stop layer, an oxide layer, and an anti-reflection layer are sequentially stacked. In one exemplary embodiment, the etch stop layer is formed of SiN.

In order to form the adhesion spacer, first, an adhesion layer is formed to cover the semiconductor substrate exposed by the storage node hole, and the sidewall and upper surface of the concave pattern. Next, the adhesion layer is etched back so that the adhesion spacer can remain only on the sidewall of the concave pattern.

The adhesion layer is formed of at least one material selected from the group consisting of Ti, TiN, TiSiN, TiAlN, $TiO_2$, Ta, $Ta_2O_5$, TaN, TaAlN, TaSiN, $Al_2O_3$, W, WN, Co, and CoSi.

The adhesion layer can be formed by a chemical vapor deposition (CVD) method, a physical vapor deposition (PVD) method, a metal-organic deposition (MOD) method, a sol-gel method, or an atomic layer deposition (ALD) method.

In order to form the lower electrode, first, a first conductive layer is formed to cover an upper surface of the contact and the adhesion spacer which are exposed in the storage node hole, and the upper surface of the concave pattern. A sacrificial layer having a thickness that can completely fill the storage node hole is formed on the first conductive layer. The first conductive layer is divided into a plurality of lower electrodes by removing parts of the first conductive layer and sacrificial layer on the concave pattern until the upper surface of the concave pattern is exposed. The residual part of the sacrificial layer is removed.

The first conductive layer is formed of a material selected from the group consisting of a platinum-group metal, a platinum-group metal oxide, and an oxide having a perovskite structure. Preferably, the sacrificial layer is a photoresist layer or an oxide layer.

The parts of the first conductive layer and sacrificial layer are removed by an etch-back method or a chemical mechanical polishing (CMP) method.

When the sacrificial layer is a photoresist layer, the residual part of the sacrificial layer is removed by ashing. When the sacrificial layer is an oxide layer, the residual part of the sacrificial layer is wet-etched out, thereby removing the layer.

In the method of fabricating a concave capacitor according to the present invention, after the lower electrode is formed, a dielectric layer is formed on the lower electrode, and a second conductive layer for forming an upper electrode is then formed on the dielectric layer, thereby forming the concave capacitor.

The dielectric layer is formed of at least one material selected from the group consisting of $Ta_2O_5$, $Al_2O_3$, $SiO_2$, $SrTiO_3$, $BaTiO_3$, $(Ba,Sr)TiO_3$, $PbTiO_3$, $(Pb,Zr)TiO_3$, $Pb(La,Zr)TiO_3$, $Sr_2Bi_2NbO_9$, $Sr_2Bi_2TaO_9$, $LiNbO_3$, and $Pb(Mg,Nb)O_3$.

The second conductive layer is formed of a material selected from the group consisting of a platinum-group metal, a platinum-group metal oxide, TiN, and an oxide having a perovskite structure.

According to the present invention, bonding between the lower electrode and the concave pattern is enhanced by the adhesion spacer formed on the sidewall of the concave pattern. Thus, it would be of no concern if the lower electrode were to be lifted from the concave pattern.

BRIEF DESCRIPTION OF THE DRAWINGS

The above objective and advantage of the present invention will become more apparent by describing in detail a preferred embodiment thereof with reference to the attached drawings in which.

DESCRIPTION OF THE PREFERRED EMBODIMENT

Figure 1:
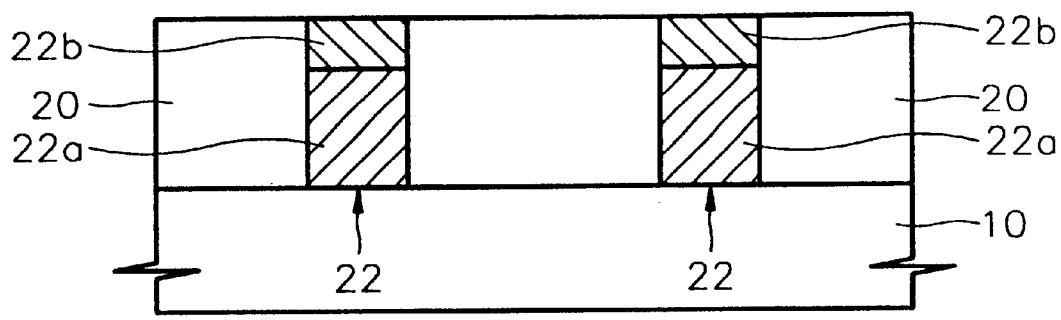
FIGS. 1 through 10 are cross-sectional views sequentially illustrating the processes for fabricating a concave capacitor for semiconductor memory devices, according to a preferred embodiment of the present invention.

Referring to FIG. 1, a first interlayer dielectric film 20 is formed on a semiconductor substrate 10, and a contact 22 is connected to an active region of the semiconductor substrate 10 through the first interlayer dielectric film 20. Preferably, the contact 22 comprises a polysilicon layer 22a contacting the active region of the semiconductor substrate 10 and a contact plug 22b deposited on the polysilicon layer 22a and exposed on the first interlayer dielectric film 20. The contact plug 22b serves as a barrier for preventing an undesired reaction from occurring between a lower electrode material and the polysilicon layer 22a in a subsequent thermal treatment process. The contact plug 22b can be formed of only the TiN layer, or can be formed of TiAlN, TiSiN, TaN, TaSiN, or TaAlN.

Figure 2:
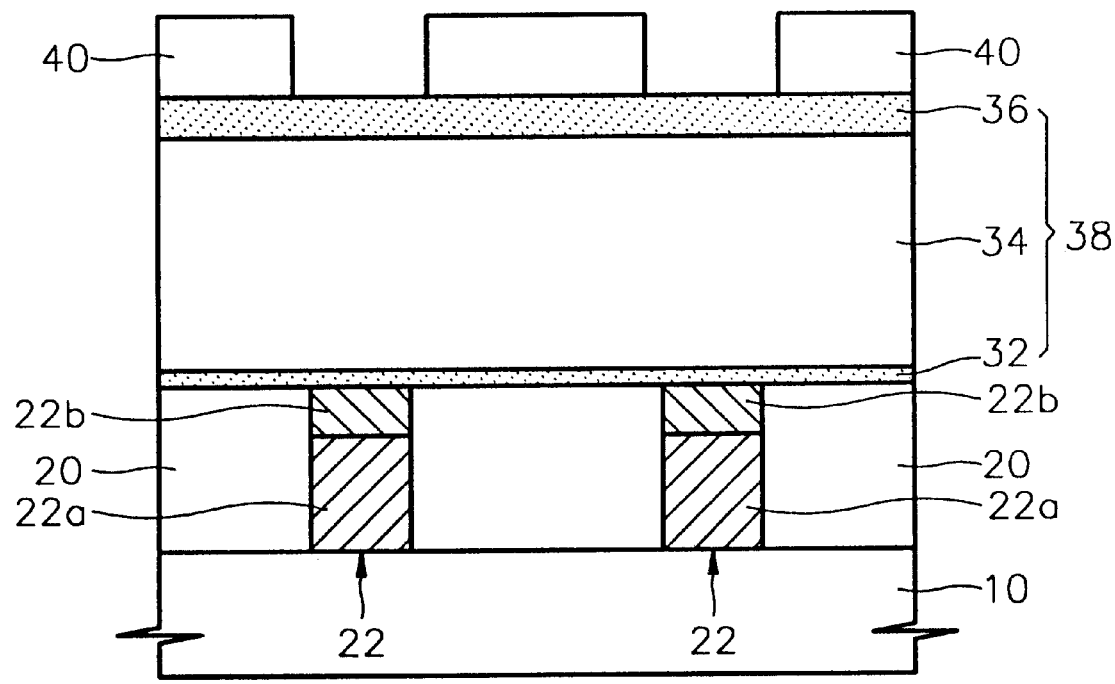

Referring to FIG. 2, a second interlayer dielectric film 38 comprising an etch stop layer 32, an oxide layer 34, and an anti-reflection layer 36 is formed on the resultant structure on which the contact 22 is formed. In order to form the second interlayer dielectric layer 38, first, the etch stop layer 32, e.g., an SiN layer, is formed to a thickness of about 50 to 100 Å on the upper surface of the first interlayer dielectric film 20 and an upper surface of the contact plug 22b which is the exposed surface of the contact 22. The oxide layer 34 having a thickness corresponding to a desired lower electrode height is formed on the etch stop layer 32. The oxide layer 34 can be formed of any oxide that is typically used to form an interlayer dielectric film. Then, the anti-reflection layer 36 made of SiON is formed on the oxide layer 34.

A photoresist pattern 40 is formed on the second interlayer dielectric film 38.

Figure 3:
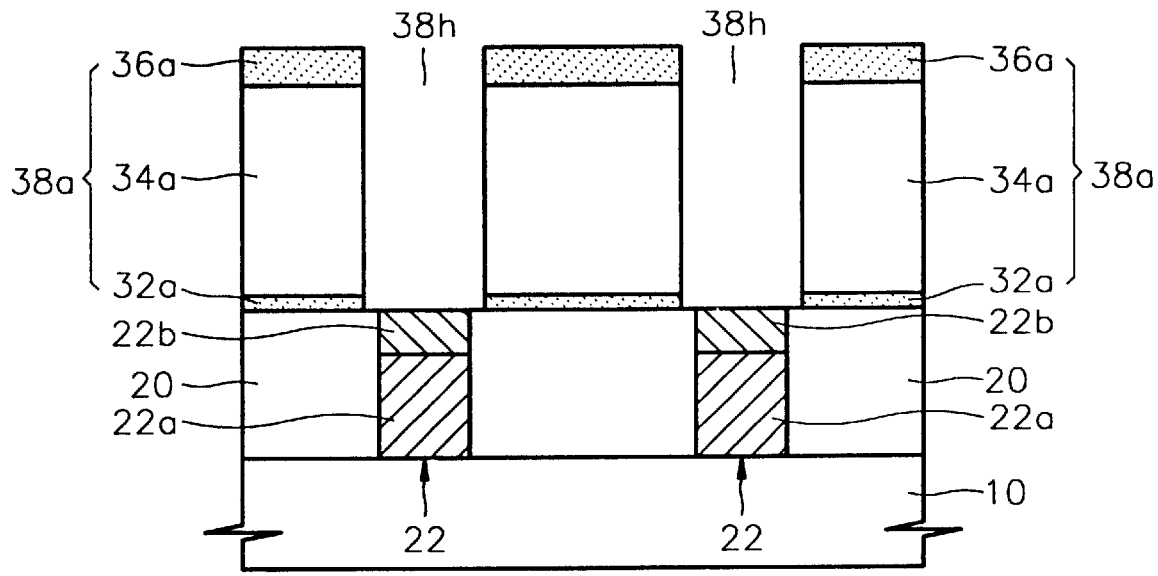

Referring to FIG. 3, the second interlayer dielectric film 38 is dry-etched up to the etch stop layer 32 which acts as an etch end point using the photoresist pattern 40 as an etch mask. As a result, a concave pattern 38a is formed. Here, a portion formed on the contact 22 among the etch stop layer 32 used as the etch end point may be completely removed by over etching. As a consequence, the concave pattern 38a comprises an etch stop layer pattern 32a, an oxide layer pattern 34a and an anti-reflection layer pattern 36a, and a storage node hole 38h exposing the upper surface of the contact 22. Thereafter, the photoresist pattern 40 is removed.

Figure 4:
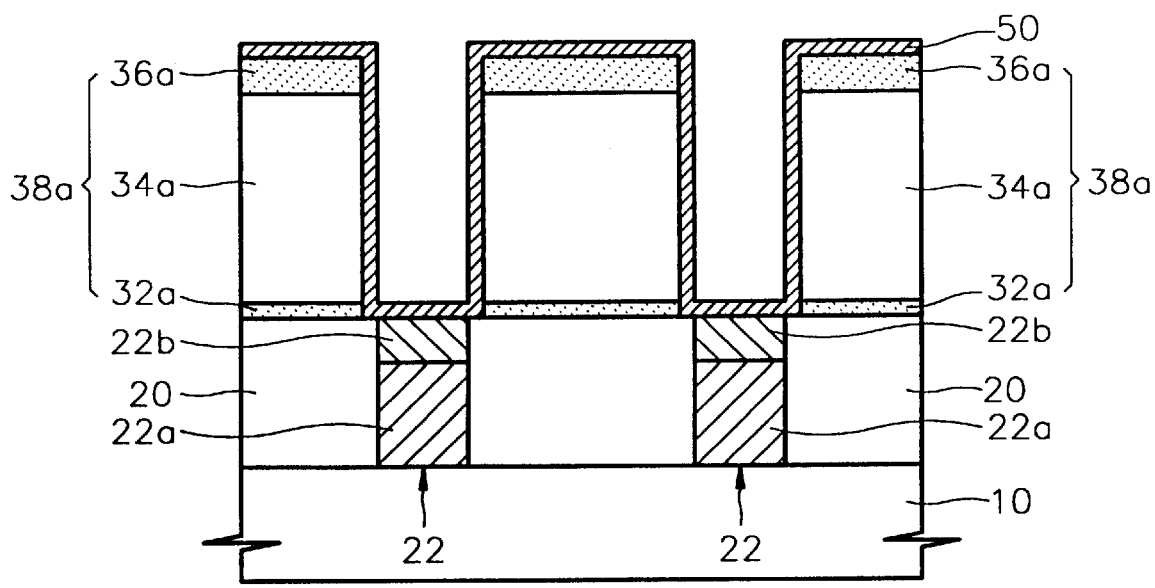
Figure 5:
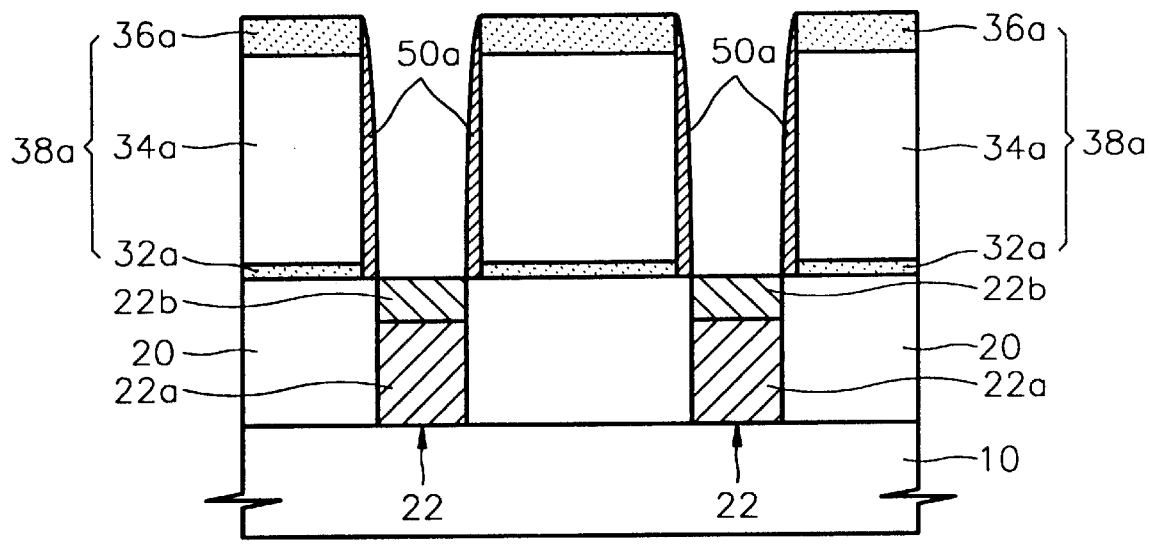

FIGS. 4 and 5 are cross-sectional views illustrating the step of forming an adhesion spacer 50a for improving the bonding between the concave pattern 38a and a lower electrode formed in a subsequent process, on the sidewalls of the concave pattern 38a exposed by the storage node hole 38h.

To be more specific, in FIG. 4, an adhesion layer 50 is formed to cover the contact 22 exposed by the storage node hole 38h, and the sidewall and upper surface of the concave pattern 38a. The adhesion layer 50 can be formed of at least one material selected from the group consisting of Ti, TiN, TiSiN, TiAlN, $TiO_2$, Ta, $Ta_2O_5$, TaN, TaAlN, TaSiN, $Al_2O_3$, W, WN, Co, and CoSi, using a chemical vapor deposition (CVD) method, a physical vapor deposition (PVD) method, a metal-organic deposition (MOD) method, a sol-gel method, or an atomic layer deposition (ALD) method.

The adhesion layer 50 undergoes an etchback process until the adhesion spacer 50a remains on only the sidewall of the concave pattern 38a. Thus, only the adhesion spacer 50a and the contact 22 are exposed within the storage node hole 38h.

FIGS. 6 through 9 are cross-sectional views illustrating the step of forming a lower electrode 60a in the storage node hole 38h.

Figure 6:
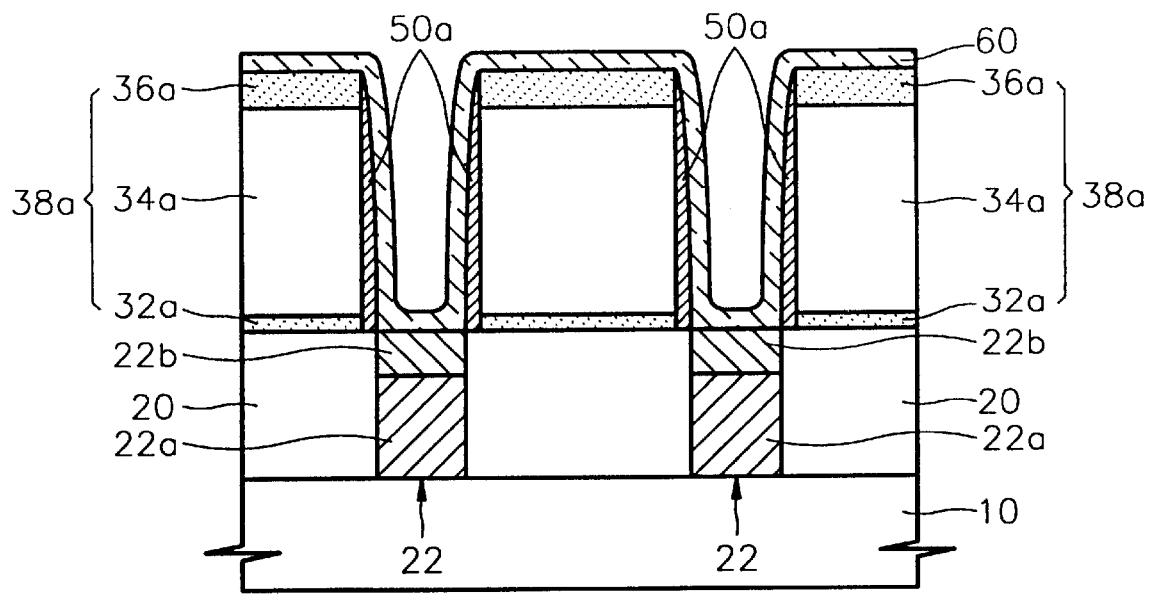

As shown in FIG. 6, a first conductive layer 60 is formed to cover the upper surface of the contact 22 and the adhesion spacer 50a which are exposed within the storage node hole 38h, and the upper surface of the concave pattern 38a.

The first conductive layer 60 can be formed by depositing a platinum-group metal, a platinum-group metal oxide, or a material having a perovskite structure using the PVD or CVD method. For example, the first conductive layer 60 can be formed of Pt, Ru, Ir, $RuO_2$, $IrO_2$, $SrRuO_3$, $BaSrRuO_3$, or $CaSrRuO_3$.

Figure 7:
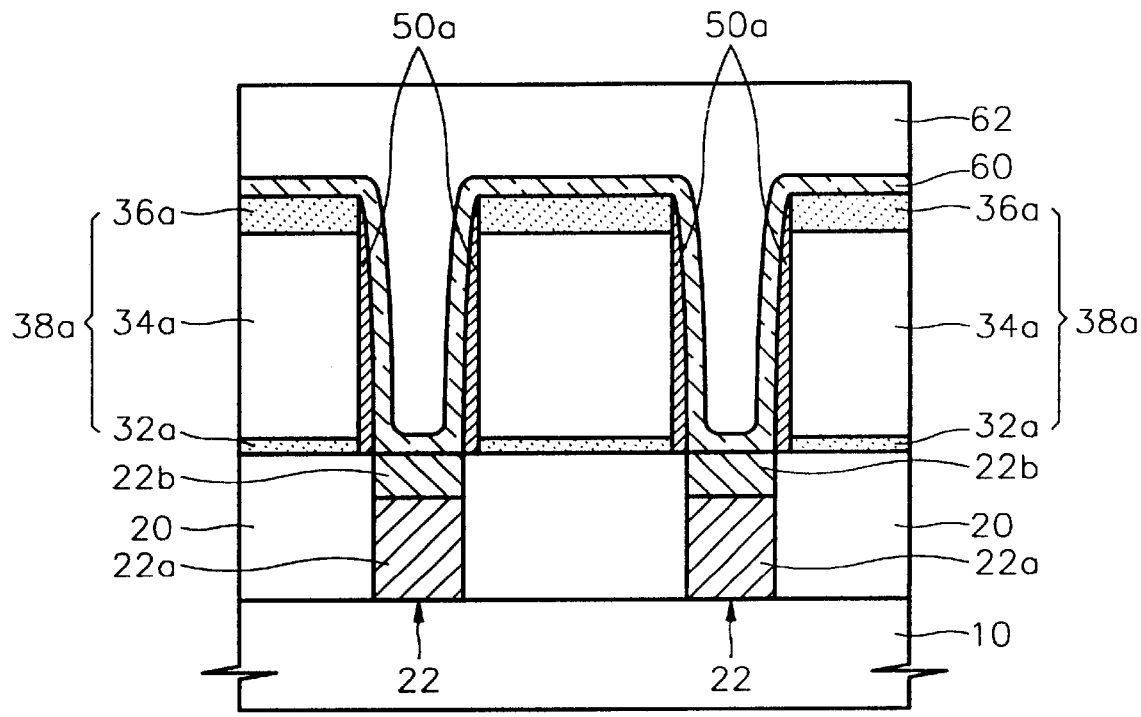

As shown in FIG. 7, a sacrificial layer 62 having a thickness which can sufficiently fill the storage node hole 38h is formed on the resultant structure on which the first conductive layer 60 has been formed. The sacrificial layer 62 can be a photoresist layer or an oxide layer.

Figure 8:
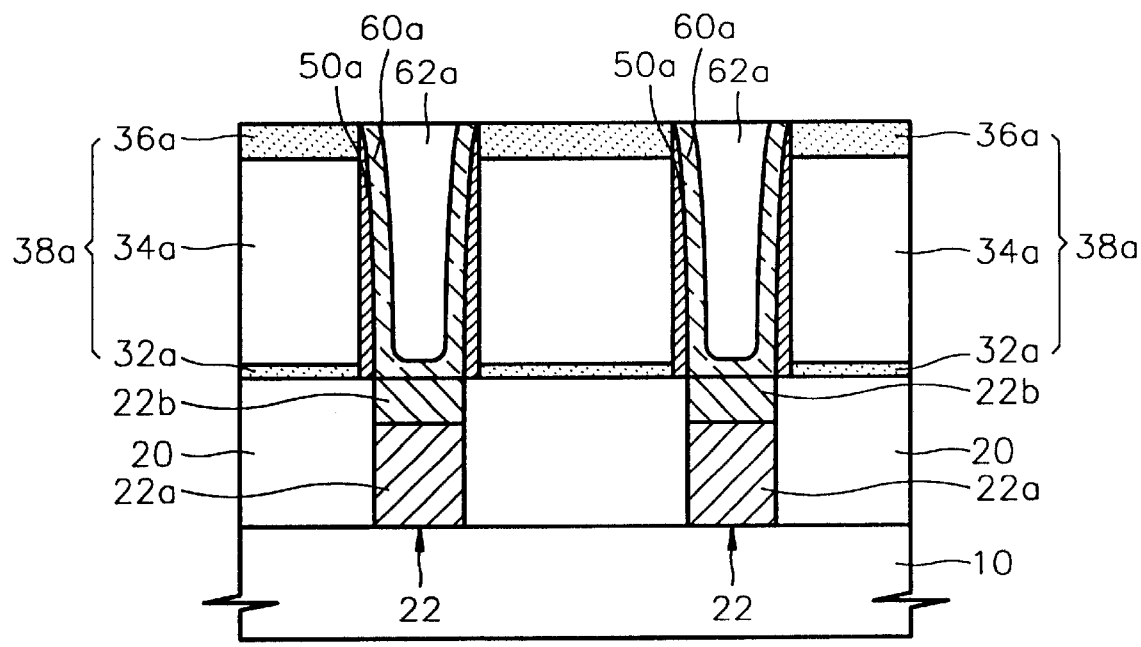

The first conductive layer 60 and sacrificial layer 62 on the concave pattern 38a are etched back or removed by chemical mechanical polishing (CMP) until the upper surface of the concave pattern 38a is exposed. Consequently, the first conductive layer 60 is divided into a plurality of lower electrodes 60a as shown in FIG. 8. Each of the lower electrodes 60a covers the upper surface of the contact 22, and the adhesion spacer 50a in the storage node hole 38h.

Figure 9:
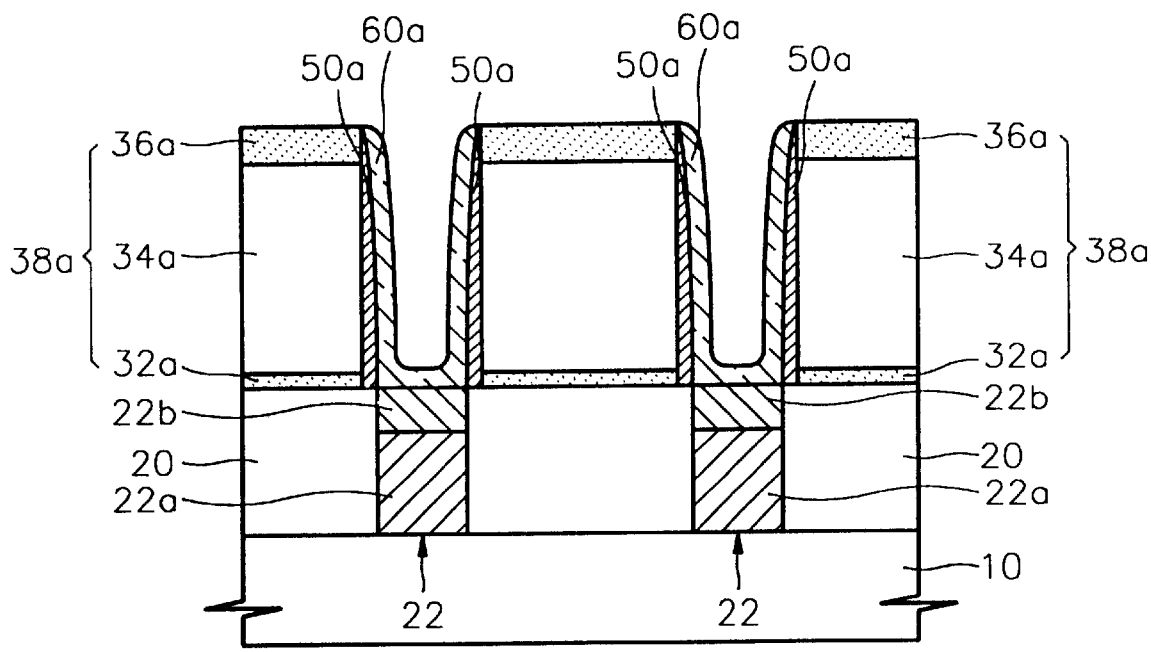

In the storage node hole 38h, the residual portion 62a of the sacrificial layer 62 remains on the lower electrode 60a. The residual portion 62a of the sacrificial layer 62 is removed by ashing or wet etch, thus obtaining a resultant structure as shown in FIG. 9. When the sacrificial layer 62 is a photoresist layer, the residual portion 62a of the sacrificial layer 62 is removed by ashing. When the sacrificial layer 62 is an oxide layer, the residual portion 62a of the sacrificial layer 62 is wet-etched out.

Here, the photoresist layer or oxide layer forming the sacrificial layer 62 can be removed at an excellent selectivity with respect to SiON forming the anti-reflection layer pattern 36a in the upper portion of the concave pattern 38a and a conductive material forming the lower electrode 60a. Therefore, when the residual portion 62a of the sacrificial layer 62 is removed, other portions on the semiconductor substrate 10 are not damaged.

Figure 10:
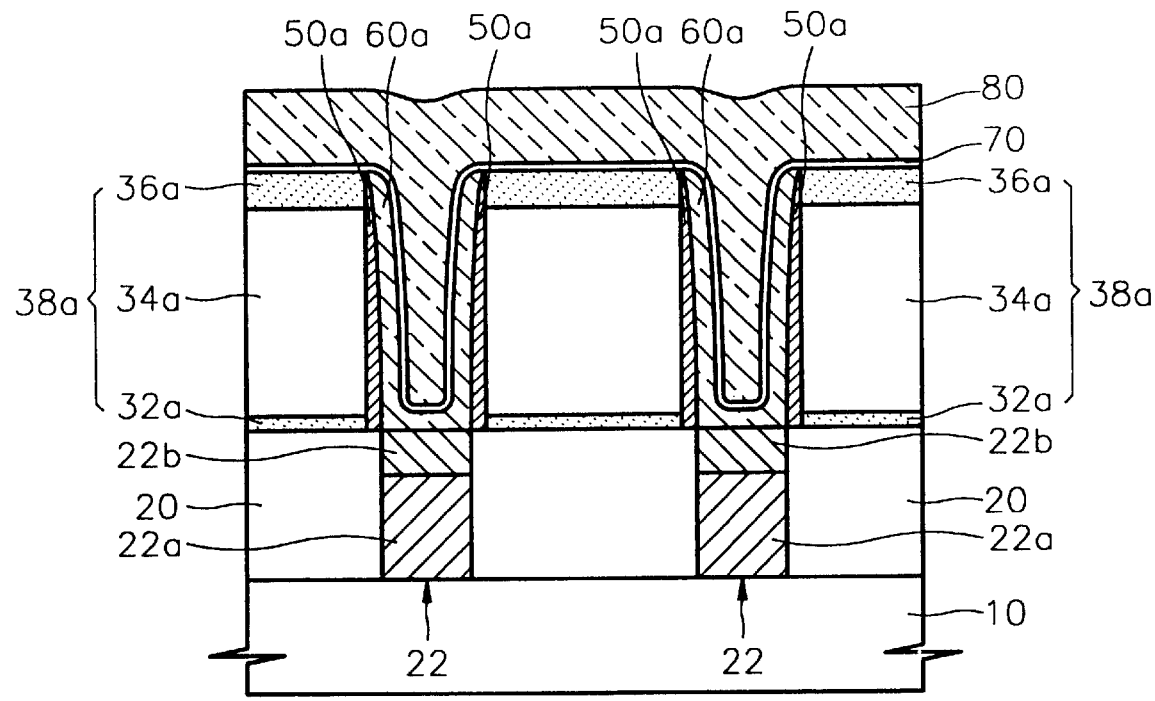

Referring to FIG. 10, a dielectric layer 70 is formed on the lower electrode 60a. The dielectric layer 70 can be formed of at least one material selected from the group consisting of $Ta_2O_5$, $Al_2O_3$, $SiO_2$, $SrTiO_3$, $BaTiO_3$, $(Ba,Sr)TiO_3$, $PbTiO_3$, $(Pb,Zr)TiO_3$, $Pb(La,Zr)TiO_3$, $Sr_2Bi_2NbO_9$, $Sr_2Bi_2TaO_9$, $LiNbO_3$, and $Pb(Mg,Nb)O_3$. The dielectric layer 70 can be formed by the PVD method, the CVD method, or the sol-gel method.

Next, a second conductive layer 80 is formed on the dielectric layer 70, thus forming an upper electrode of a capacitor. The second conductive layer 80 can be formed by depositing a platinum-group metal, a platinum-group metal oxide, TiN, or a material having a perovskite structure using the PVD method, the CVD method, the MOD method, or the ALD method. For example, the second conductive layer 80 can be formed of Pt, Ru, Ir, $RuO_2$, $IrO_2$, TiN, $SrRuO_3$, $BaSrRuO_3$, or $CaSrRuO_3$.

In this way, the concave capacitor according to the present invention is completed. In the concave capacitor according to the present invention fabricated as described above, the adhesion spacer 50a is formed between the lower electrode 60a and the concave pattern 38a to increase the bonding between the conductive material for the lower electrode 60a and the dielectric material for the concave pattern 38a. Hence, the lower electrode 50a is not lifted from the concave pattern 38a.

The adhesion spacer 50a is formed on only the sidewall of the concave pattern 38a, and thus does not affect the conductivity between the lower electrode 60a and the contact 22.

According to the concave capacitor fabrication method of the present invention, an adhesion spacer is formed on the sidewall of a concave pattern exposed by a storage node hole, before a lower electrode is formed. The adhesion spacer improves the bonding between the lower electrode and the concave pattern, so that the lower electrode is not lifted from the concave pattern even when it is thermally treated in a subsequent process. Therefore, a degradation of the electrical characteristics of a capacitor due to the lifting of the lower electrode can be prevented.

The present invention is described in more detail with reference to a preferred embodiment, but it is not limited to the embodiment. Various modifications may be effected within the technical spirit of the present invention by those skilled in the art.

What is claimed is:

1. A method of fabricating a concave capacitor for a semiconductor memory device, comprising:
   forming an interlayer dielectric film on a semiconductor substrate;
   forming a concave pattern having a storage node hole exposing a portion of an upper surface of the semiconductor substrate, by patterning the interlayer dielectric film;
   forming an adhesion spacer only on a sidewall of the concave pattern exposed by the storage node hole; and
   forming a lower electrode to cover the adhesion spacer and the upper surface of the semiconductor substrate exposed by the storage node hole, in the storage node hole.

2. The method of fabricating a concave capacitor for a semiconductor memory device as claimed in claim 1, wherein in forming the interlayer dielectric film, the semiconductor substrate includes a contact having one end connected to an active region of the semiconductor substrate and the other end exposed on the upper surface of the semiconductor substrate, and in forming the concave pattern, the other end of the contact is exposed by the storage node hole.

3. The method of fabricating a concave capacitor for a semiconductor memory device as claimed in claim 2, wherein the other end of the contact is formed of a material selected from the group consisting of TiN, TiAlN, TiSiN, TaN, TaSiN and TaAlN.

4. The method of fabricating a concave capacitor for a semiconductor memory device as claimed in claim 1, wherein in forming the interlayer dielectric film, the interlayer dielectric film has a structure in which an etch stop layer, an oxide layer, and an anti-reflection layer are sequentially stacked.

5. The method of fabricating a concave capacitor for a semiconductor memory device as claimed in claim 4, wherein the etch stop layer is formed of SiN.

6. The method of fabricating a concave capacitor for a semiconductor memory device as claimed in claim 1, wherein forming the adhesion spacer comprises:
   forming an adhesion layer for covering the semiconductor substrate exposed by the storage node hole, and the sidewall and upper surface of the concave pattern; and
   etching back the adhesion layer so that the adhesion spacer can remain only on the sidewall of the concave pattern.

7. The method of fabricating a concave capacitor for a semiconductor memory device as claimed in claim 6, wherein the adhesion layer is formed by depositing at least one material selected from the group consisting of Ti, TiN, TiSiN, TiAlN, $TiO_2$, Ta, $Ta_2O_5$, TaN, TaAlN, TaSiN, $Al_2O_3$, W,WN, Co, and CoSi.

8. The method of fabricating a concave capacitor for a semiconductor memory device as claimed in claim 7, wherein the adhesion layer is formed by a chemical vapor deposition (CVD) method, a physical vapor deposition (PVD) method, a metal-organic deposition (MOD) method, a sol-gel method, or an atomic layer deposition (ALD) method.

9. The method of fabricating a concave capacitor for a semiconductor memory device as claimed in claim 1, wherein forming the lower electrode comprises:
   forming a first conductive layer to cover an upper surface of the contact and the adhesion spacer which are exposed in the storage node hole, and an upper surface of the concave pattern;
   forming a sacrificial layer having a thickness that can completely fill the storage node hole, on the first conductive layer;
   dividing the first conductive layer into a plurality of lower electrodes by removing the first conductive layer and sacrificial layer on the concave pattern until the upper surface of the concave pattern is exposed; and
   removing residual portion of the sacrificial layer.

10. The method of fabricating a concave capacitor for a semiconductor memory device as claimed in claim 9, wherein the first conductive layer is formed of a material selected from the group consisting of a platinum-group metal, a platinum-group metal oxide, and an oxide having a perovskite structure.

11. The method of fabricating a concave capacitor for a semiconductor memory device as claimed in claim 9, wherein the sacrificial layer is a photoresist layer or an oxide layer.

12. The method of fabricating a concave capacitor for a semiconductor memory device as claimed in claim 9, wherein in dividing the first conductive layer, the first conductive layer and sacrificial layer on the concave pattern are removed by an etch-back method or a chemical mechanical polishing (CMP) method.

13. The method of fabricating a concave capacitor for a semiconductor memory device as claimed in claim 11, wherein the sacrificial layer is a photoresist layer, and the residual portion of the sacrificial layer is removed by ashing in the removal of the residual part of the sacrificial layer.

14. The method of fabricating a concave capacitor for a semiconductor memory device as claimed in claim 11, wherein the sacrificial layer is an oxide layer, and the residual portion of the sacrificial layer is wet-etched out in the removal of the residual portion of the sacrificial layer.

15. The method of fabricating a concave capacitor for a semiconductor memory device as claimed in claim 1, after forming the lower electrode, further comprises:

forming a dielectric layer on the lower electrode; and forming a second conductive layer to form an upper electrode, on the dielectric layer.

16. The method of fabricating a concave capacitor for a semiconductor memory device as claimed in claim 15, wherein the dielectric layer is formed of at least one material selected from the group consisting of $Ta_2O_5$, $Al_2O_3$, $SiO_2$, $SrTiO_3$, $BaTiO_3$, $(Ba,Sr)TiO_3$, $PbTiO_3$, $(Pb,Zr)TiO_3$, $Pb(La,Zr)TiO_3$, $Sr_2Bi_2NbO_9$, $Sr_2Bi_2TaO_9$, $LiNbO_3$, and $Pb(Mg,Nb)O_3$.

17. The method of fabricating a concave capacitor for a semiconductor memory device as claimed in claim 15, wherein the second conductive layer is formed of a material selected from the group consisting of a platinum-group metal, a platinum-group metal oxide, TiN, and an oxide having a perovskite structure.

* * * * *

UNITED STATES PATENT AND TRADEMARK OFFICE
CERTIFICATE OF CORRECTION

PATENT NO. : 6,284,589 B1
DATED : September 4, 2001
INVENTOR(S) : Lim et al.

It is certified that error appears in the above-identified patent and that said Letters Patent is hereby corrected as shown below:

Title page,
Item [56], References Cited, OTHER PUBLICATIONS, "Y. Kohyama et al.," reference, delete "PlanarizedStacked" and insert therefor -- Planarized Stacked --

Column 2,
Line 7, after "exposing" delete "part"

Column 3,
Line 47, before "TiN" delete "only the" and after, "TiN" delete "layer, or can be formed of"

Column 6,
Line 14, after "and" delete "TaA1N" and insert therefor -- TaAIN --
Line 38, before "Co," delete "W,WN," and insert therefor -- W, WN --

Signed and Sealed this

Fifth Day of April, 2005

JON W. DUDAS
*Director of the United States Patent and Trademark Office*